United States Patent [19]

Blankenburg

[11] 3,794,942

[45] Feb. 26, 1974

[54] SYSTEM OF VARIABLE CAPACITY DIODES

[75] Inventor: Gunther Blankenburg, Schuckshohe, Germany

[73] Assignee: U.S. Philips Corporation, New York, N.Y.

[22] Filed: Feb. 14, 1973

[21] Appl. No.: 332,290

Related U.S. Application Data

[63] Continuation of Ser. No. 103,762, Jan. 4, 1971, abandoned.

[30] Foreign Application Priority Data

Feb. 12, 1970 Germany ........................... 2006333

[52] U.S. Cl. ............ 334/15, 307/320, 317/234 UA

[51] Int. Cl. ........................... H03j 3/20, H03h 5/12

[58] Field of Search .... 325/462; 334/15, 55, 78, 83; 307/320; 317/234 UA, 234 W, 235 G, 254

[56] References Cited

UNITED STATES PATENTS 3,657,609 4/1972 Oswald et al. .............. 317/234 UA

*Primary Examiner*—Paul L. Gensler

*Attorney, Agent, or Firm*—Frank R. Trifari

[57] ABSTRACT

An arrangement for tuning a receiver over two or more frequency ranges comprising at least two interconnected variable capacity systems. Each system comprises at least first and second capacitor elements, means for connecting in parallel respective first capacitors of the two systems together to form a composite variable capacitor for tuning within one of the frequency ranges, and means for connecting respective second capacitors of the two systems together to form a composite variable capacitor for tuning within the second of the frequency ranges.

2 Claims, 1 Drawing Figure

PATENTED FEB 26 1974
3,794,942
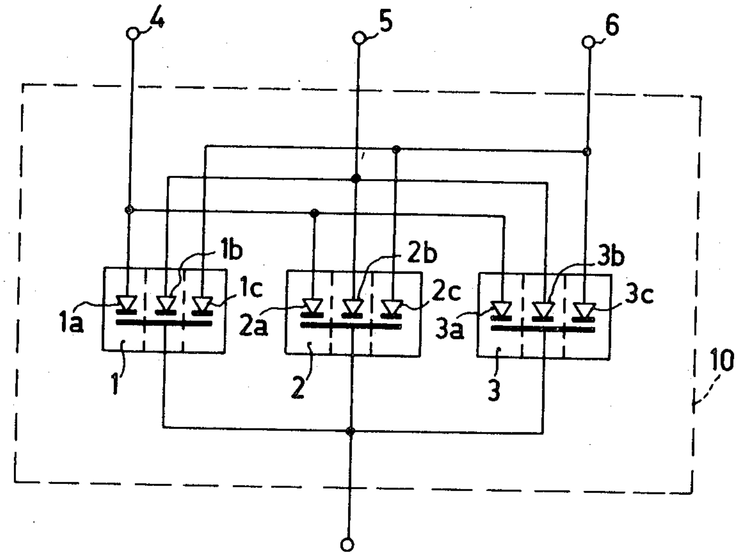
INVENTOR.
GUNTHER BLANKENBURG
BY
AGENT

SYSTEM OF VARIABLE CAPACITY DIODES

This is a continuation of application Ser. No. 103,762 filed Jan. 4, 1971 and now abandoned.

The invention relates to a system of variable capacity diodes for tuning a receiver of electrical signals including a plurality of tracked tuned circuits, for example, for tuning a medium-wave and/or long-wave radio receiver.

If a system of variable capacity diodes is used for tuning such receivers including circuits having a comparatively low resonant frequency, the individual variable capacity diodes must have a comparatively high maximum capacity. For example, in medium and/or long-wave radio receivers the maximum capacity for each variable capacity diode is approximately 600 pF. Generally three or more tuned resonant circuits are present in such a receiver; hence a system of variable capacity diodes comprising three or more variable capacity diodes is required, while the capacity-voltage characteristics of the diodes may deviate only slightly from each other in order to ensure satisfactory tracking of the circuits.

If such a system of variable capacity diodes is manufactured in such a manner that each diode having a maximum capacity of approximately 600 pF is included as a separate structural element, it is found that extremely high costs of measuring and sorting operations must be made in order to compose systems of three diodes each whose characteristics satisfy the requirements to be imposed with respect to tracking.

To obviate this drawback it is known to compose the diodes of a system in that they are manufactured from directly juxtaposed portions of a silicon disc, for example, by providing the three diode junctions closely together on a common crystal.

The crystal surface covered by a variable capacity diode (of approximately 600 pF) for medium-wave and/or for long-wave radio receivers and for similar equipment is, however, so large that as has been proved by experience, the output of satisfactory variable capacity diode systems whose diodes have sufficiently equal characteristics is very small when using this method.

The object of the present invention is to provide a system of variable capacity diodes in which diodes having characteristics adapted to each other are obtained with considerably lower costs and in which the output of such diode systems is considerably increased and to this end the present invention is characterized in that each variable capacity diode of the system is composed of at least two parallel arranged partial diodes each of which is provided in a different semiconductor crystal range, the number of crystal ranges being equal to the number of parallel arranged partial diodes and the number of partial diodes located together in a crystal range being equal to the number of the variable capacity diodes of the system.

In a further embodiment of the invention, in which the number of separate structural elements is maintained as small as possible, the individual semiconductor crystal ranges each comprising a plurality of partial diodes are combined in a common envelope, or it is possible to form the crystal ranges of a system as part of a single larger crystal on which also the required parallel connections between the partial diodes may be provided.

According to the invention a system of variable capacity diodes which must serve as a tuning element for a medium and/or long-wave radio receiver consists preferably of three semiconductor crystal ranges in which three partial diodes of approximately 200 pF are provided for each crystal range and in which a partial diode of each crystal range is arranged in parallel with a partial diode of each further crystal range.

The invention is based on the recognition of the fact that diodes of comparatively low values (of, for example, 200 pF) being located closely together on a crystal range essentially have characteristics which are more equal to each other than if the case for the diodes of higher value (of, for example, 600 pF) covering more crystal surface. Due to the fact that the characteristics of the partial diodes provided for a semiconductor crystal range deviate from each other to a slight extent only, the variations of the characteristics of the variable capacity diodes obtained by parallel arrangement of these partial diodes only deviate slightly or even less than those of the partial diodes. As a result it is not necessary to use very tedious methods of collecting suitably matched diodes while the probability that a large quantity must then be discarded as rejects is much less than for diodes of high capacity which are obtained without parallel arrangement of partial diodes.

In order that the invention may be readily carried into effect, an embodiment thereof will now be described in detail, by way of example, with reference to the accompanying diagrammatic drawing.

The FIGURE shows a system of variable capacity diodes according to the invention comprising three diodes which may serve as a tuning element for three tracked resonant circuits in a receiver for electrical signals, for example, a medium and/or long-wave radio receiver. The variable capacity diodes are provided on three semiconductor crystals or crystal ranges 1, 2 and 3, each crystal of which supports three partial diodes 1*a* to 1*c*, 2*a* to 2*c* and 3*a* to 3*c* manufactured in accordance with the known Mesa or planar technology. Each of these partial diodes has, for example, a maximum capacity of approximately 200 pF. The characteristics of the partial diodes provided on a crystal, thus for example the diodes 1*a* to 1*c*, deviate from each other to a slight extent only.

Each of the three variable capacity diodes required for the three circuits to be tuned is obtained by arranging one of the partial diodes of the three crystals every time in parallel. Thus the partial diodes 1*a*, 2*a* and 3*a* (of approximately 200pF each) of the three crystals 1, 2 and 3 are parallel arranged and together constitute a variable capacity diode which has a maximum capacity of 600 pF on the terminal 4 for the first tuning circuit. Correspondingly, the other partial diodes 1*b* to 3*b* and 1*c* to 3*c* are parallel arranged and therefore constitute further variable capacity diodes on the terminals 5 and 6 for the further tuning circuits. The assembly may be surrounded by a common envelope 10. Since the characteristics of the partial diodes obtained on a single crystal or crystal range deviate from each other to a slight extent only, variable capacity diodes are obtained whose characteristics likewise deviate from each other only to a slight extent.

The parasitic capacitances present between the partial diode on a crystal are generally found to be so small that they do not lead to unwanted couplings between the formed variable capacity diodes and hence between the resonant circuits in which these variable capacity diodes have been arranged.

What is claimed is:

1. An arrangement for tuning a receiver having at least two tracked tuned circuits, comprising at least first and second separate variable capacity systems, each variable capacity system comprising at least first and second semiconductive variable capacity elements formed close to each other on a semiconductive crystal region to provide substantially equal voltage-capacity characteristics, means for connecting respective first elements of said variable capacity systems, in parallel to form a composite variable capacitor for tuning the first of said tracked tuned circuits, and means for connecting respective second elements of said variable capacity systems in parallel to form a composite variable capacitor for tuning the second of said tracked tuned circuits, the number of variable capacity systems being equal to the number of elements connected in parallel to constitute one composite variable capacitor, and the number of elements in one system being equal to the number of tracked tuned circuits.

2. An arrangement as claimed in claim 1 wherein said first and second separate variable capacity systems are contained within a common envelope.

* * * * *

PO-1050
(5/69)

UNITED STATES PATENT OFFICE
CERTIFICATE OF CORRECTION

Patent No. 3,794,942 Dated February 27, 1974

Inventor(s) GUNTHER BLANKENBURG

It is certified that error appears in the above-identified patent and that said Letters Patent are hereby corrected as shown below:

On the title page Section [30] change "2006333" to

--P.2006333.6--.

Signed and sealed this 18th day of June 1974.

(SEAL)
Attest:

EDWARD M.FLETCHER,JR.
Attesting Officer

C. MARSHALL DANN
Commissioner of Patents